(12) United States Patent
Mahendra

(10) Patent No.: US 11,128,214 B2
(45) Date of Patent: Sep. 21, 2021

(54) MULTI-CHANNEL POWER CONTROLLER

(71) Applicant: Nicslab Pty Ltd, Sydney (AU)

(72) Inventor: Andri Mahendra, Sydney (AU)

(73) Assignee: NICSLAB PTY LTD., New South Wales (AU)

( * ) Notice: Subject to any disclaimer, the term of this patent is extended or adjusted under 35 U.S.C. 154(b) by 0 days.

(21) Appl. No.: 16/958,616

(22) PCT Filed: Dec. 21, 2018

(86) PCT No.: PCT/AU2018/051392
§ 371 (c)(1),
(2) Date: Jun. 26, 2020

(87) PCT Pub. No.: WO2019/126839
PCT Pub. Date: Jul. 4, 2019

(65) Prior Publication Data
US 2020/0366197 A1   Nov. 19, 2020

Related U.S. Application Data

(60) Provisional application No. 62/610,871, filed on Dec. 27, 2017.

(51) Int. Cl.
*H02M 3/155* (2006.01)
*G01D 11/00* (2006.01)
*H02M 7/04* (2006.01)
*H03M 1/66* (2006.01)

(52) U.S. Cl.
CPC ............ *H02M 3/155* (2013.01); *G01D 11/00* (2013.01); *H02M 7/04* (2013.01); *H03M 1/66* (2013.01)

(58) Field of Classification Search
CPC ............ H02J 4/00; H02M 3/155; H02M 7/04
See application file for complete search history.

(56) References Cited

U.S. PATENT DOCUMENTS

| 8,996,140 | B2 | 3/2015 | Goto et al. | |
| 9,702,910 | B2 * | 7/2017 | Baldridge | H03K 17/0822 |
| 2004/0051383 | A1 | 3/2004 | Clark et al. | |

(Continued)

FOREIGN PATENT DOCUMENTS

JP        2011113379 A  *  6/2011

OTHER PUBLICATIONS

International Search Report for PCT/AU2018/051392 dated Mar. 12, 2019.

*Primary Examiner* — Adam D Houston
(74) *Attorney, Agent, or Firm* — Tarolli, Sundheim, Covell & Tummino LLP

(57) ABSTRACT

Disclosed is a multi-channel power controller. The multi-channel power controller comprises a processing system configured to generate one or more control signals, and one or more extender modules operatively coupled to the processing system. The one or more 5 extender modules are configured to receive an input electrical power. Each extender module of the one or more extender modules is configured to receive a control signal of the one or more control signals, receive a portion of the input electrical power, and generate a plurality of output electrical powers using the received control signal and the portion of the input electrical power. Also disclosed is a power control system.

20 Claims, 13 Drawing Sheets

(56) References Cited

U.S. PATENT DOCUMENTS

| | | | |
|---|---|---|---|
| 2007/0141869 A1* | 6/2007 | McNeely | A47C 27/083 439/76.1 |
| 2009/0160740 A1* | 6/2009 | Leon | G09G 3/3291 345/76 |
| 2011/0198926 A1* | 8/2011 | Xu | H02M 1/44 307/38 |
| 2011/0204964 A1* | 8/2011 | Xu | H03K 19/0016 327/543 |
| 2012/0049626 A1* | 3/2012 | Xu | H02J 3/14 307/41 |
| 2016/0156194 A1 | 6/2016 | Fritz et al. | |
| 2016/0327917 A1 | 11/2016 | Dickey et al. | |
| 2019/0104633 A1* | 4/2019 | Ross | G05B 19/05 |
| 2020/0350779 A1* | 11/2020 | Tikhonski | H02J 7/0029 |
| 2020/0366079 A1* | 11/2020 | Telefus | G01R 19/175 |
| 2020/0366197 A1* | 11/2020 | Mahendra | H02J 13/0003 |
| 2021/0074498 A1* | 3/2021 | Leitensdorfer | H01H 47/001 |
| 2021/0143832 A1* | 5/2021 | Fick | H03F 3/45968 |

* cited by examiner

MULTI-CHANNEL POWER CONTROLLER

RELATED APPLICATIONS

The present invention is a U.S. National Stage under 35 USC 371 patent application, claiming priority to Serial No. PCT/AU2018/051392, filed on 21 Dec. 2018; which claims priority of U.S. Provisional Application No. 62/610,871, filed on 27 Dec. 2017, the entirety of both of which are incorporated herein by reference.

TECHNICAL FIELD

The present invention generally relates to electrical power supplies. In further specific examples, the present invention relates to a device or a system for controlling the output of an electrical power supply.

BACKGROUND

Electrical power supplies are used extensively in scientific laboratories and other experimental settings. Typically, such power supplies are provided as a standalone, benchtop device which is powered through the mains power. A power supply includes a number of power output connections (typically between one and four) whose output level may be adjusted via settings provided on the power supply.

In several applications, the number of devices that need to be powered exceeds the number of power output connections of the typical power supply. For example, electronic integrated circuits and photonic integrated circuits may contain tens or hundreds of active elements having different power requirements.

Attempts to remedy this problem often rely on using multiple power supplies. This however entails higher demands on costs and space, both of which are limited resources, particularly in a laboratory environment. Furthermore, the complexity of controlling multiple power supplies increases rapidly with the number of power supplies.

There is a need for new or improved electrical power supplies and/or devices or systems for controlling the output of electrical power supplies.

The reference in this specification to any prior publication (or information derived from the prior publication), or to any matter which is known, is not, and should not be taken as an acknowledgment or admission or any form of suggestion that the prior publication (or information derived from the prior publication) or known matter forms part of the common general knowledge in the field of endeavour to which this specification relates.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to one example aspect, there is provided a multi-channel power controller comprising: a processing system configured to generate one or more control signals; one or more extender modules operatively coupled to the processing system, the one or more extender modules being configured to receive an input electrical power; wherein each extender module of the one or more extender modules is configured to: receive a control signal of the one or more control signals; receive a portion of the input electrical power; and generate a plurality of output electrical powers using the received control signal and the portion of the input electrical power.

In certain embodiments, each extender module of the one or more extender modules comprises a converter module configured to convert the control signal into a plurality of intermediate signals.

In certain embodiments, the control signal is a digital signal.

In certain embodiments, the converter module is a multi-channel digital-to-analog converter, and the plurality of intermediate signals are analog signals.

In certain embodiments, each extender module of the one or more extender modules comprises a plurality of signal conditioners, each signal conditioner of the plurality of signal conditioners being configured to generate an output electrical power of the plurality of output electrical powers by adjusting electrical characteristics of an intermediate signal of the plurality of intermediate signals.

In certain embodiments, the electrical characteristics comprise one or more of a voltage and a current of the intermediate signal.

In certain embodiments, at least one signal conditioner of the plurality of signal conditioners comprises a voltage conditioning stage and a current conditioning stage for independently adjusting the voltage and current of the intermediate signal.

In certain embodiments, each extender module of the one or more extender modules is further configured to power the plurality of signals conditioners using the portion of the input electrical power.

In certain embodiments, the multi-channel power controller further comprises a switching module configured to route each intermediate signal of the plurality of intermediate signals to a signal conditioner of the plurality of signal conditioners.

In certain embodiments, the processing system is further configured to: select an intermediate signal of the plurality of intermediate signals; select a signal conditioner of the plurality of signal conditioners; and control the switching module to route the selected intermediate signal to the selected signal conditioner.

In certain embodiments, at least one extender module of the one or more extender modules is a current source.

In certain embodiments, the current source is configured to be controlled by the received control signal and to generate an output electrical current based on the received control signal.

In certain embodiments, the current source is configured to be powered by the portion of the input electrical power.

In certain embodiments, at least one extender module of the one or more extender modules further comprises a plurality of measuring instruments configured to measure electrical characteristics of the plurality of output electrical powers.

In certain embodiments, the measured electrical characteristics comprise one or more of a voltage and a current of the plurality of output electrical powers.

In certain embodiments, the processing system is further configured to: monitor the plurality of output electrical powers of the one or more extender modules; and adjust operational parameters of the one or more extender modules to modify a value of the respective plurality of output electrical powers.

In certain embodiments, the power control system further comprises a power converter configured to receive a further portion of the input electrical power and to convert said further portion from a first power level into a second power level for powering the processing system.

In certain embodiments, the multi-channel power controller further comprises a memory configured to store a bootloader for the processing system.

In certain embodiments, the memory is external to the processing system.

In certain embodiments, the multi-channel power controller further comprises a power supply configured to generate the input electrical power.

In certain embodiments, the power supply is a DC power supply.

In certain embodiments, the power supply is one of a battery, a fuel cell, and a solar cell.

In certain embodiments, each extender module of the one or more extender modules comprises a plurality of output channels, each output channel being configured to output an output electrical power of the plurality of electrical powers generated by the extender module.

In certain embodiments, the output channels of one or more extender modules are spatially arranged into a standard connector configuration.

In certain embodiments, each extender module of the one or more extender modules is configured to facilitate coupling and/or decoupling of the processing system from the extender module.

According to another example aspect, there is provided a power control system comprising: a multi-channel power controller; a power supply configured to supply the input electrical power to the multi-channel power controller; and a programming device in communication with the processing system, the programming device being configured to set operational settings of the processing system.

In certain embodiments, the power supply is a DC power supply.

In certain embodiments, the power supply is an AC power supply, and wherein the power control system further comprises an AC-DC converter configured to convert the input electrical power from an AC power to a DC power prior to supplying it to the multi-channel power controller.

In certain embodiments, the power control system further comprises a sensor operatively coupled to the multi-channel power controller, the sensor being configured to: measure environmental characteristics of an environment in the vicinity of the multi-channel power controller; and provide a signal indicative of the measured environmental characteristics to the processing system.

In certain embodiments, the processing system is further configured to adjust, in response to receiving the signal indicative of the measured environment characteristics, operational parameters of the one or more extender modules to modify a value of the respective plurality of output electrical powers.

In certain embodiments, the sensor is powered by an output electrical power of the plurality of output electrical powers.

In certain embodiments, the sensor is one of a temperature sensor, a humidity sensor, and a velocity sensor.

In certain embodiments, each extender module of the one or more extender modules comprises a plurality of output channels, each output channel being configured to output an output electrical power of the plurality of electrical powers generated by the extender module.

In certain embodiments, the power control system further comprises a connector board comprising an electrical cable connector operatively coupled to one or more output channels of the plurality of output channels.

In certain embodiments, the power control system further comprises a power converter configured to receive an output electrical power of the plurality of output electrical powers and to adjust a power level of the received output electrical power.

In certain embodiments, the multi-channel power controller is a first multi-channel power controller and the power control system further comprising a second multi-channel power controller operatively coupled to the first multi-channel power controller, wherein the input electrical power of the second multi-channel power controller is provided by an output electrical power of the plurality of output electrical powers of the first multi-channel power controller.

BRIEF DESCRIPTION OF FIGURES

Example embodiments are apparent from the following description, which is given by way of example only, of at least one non-limiting embodiment, described in connection with the accompanying figures.

DETAILED DESCRIPTION

Figure 1:
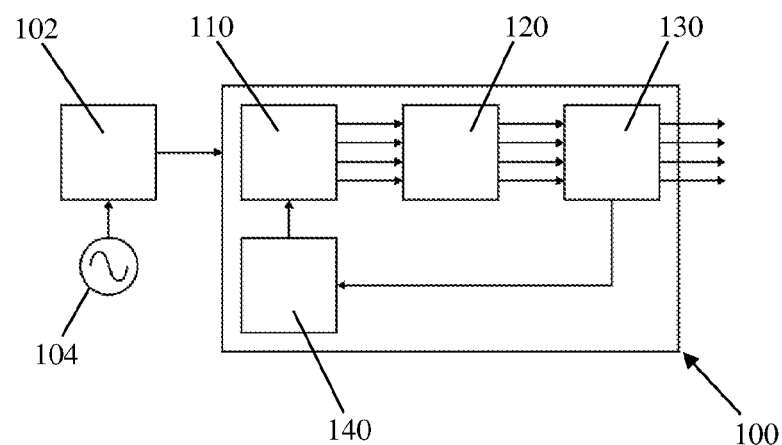
FIG. 1 illustrates a functional block diagram of an example multi-channel power controller.

The following modes, given by way of example only, are described in order to provide a more precise understanding of the subject matter of an embodiment or embodiments. In the figures, incorporated to illustrate features of an example embodiment, like reference numerals are used to identify like parts throughout the figures.

Referring to FIG. 1, there is illustrated an example multi-channel power controller 100. Multi-channel power controller 100 comprises a converter module 110, a plurality of signal conditioners 120, a plurality of measuring instruments, or measurement modules, 130, and a processing system 140.

Converter module 110, which is operatively coupled to processing system 140, may be configured to receive a control signal from processing system 140 and to convert the control signal into a plurality of intermediate signals. Multi-channel power controller 100 may comprise one or more converter modules. In cases where multi-channel power controller 100 comprises a plurality of converter modules, each converter module 110 is configured to receive a separate control signal and may operate independently of the other converter modules.

Signal conditioners 120 are operatively coupled to converter module 110 such that each signal conditioner receives one of the plurality of intermediate signals outputted by converter module 110. Each signal conditioner 120 is configured to generate an output electrical power by adjusting, conditioning, or manipulating electrical characteristics of an intermediate signal of the plurality of intermediate signals. The electrical characteristics may include one or more of a voltage and a current of the intermediate signal. In some examples, other electrical characteristics, such as a power, amplitude, frequency, and/or phase of the intermediate signal may be adjusted by the signal conditioners 120.

Measuring instruments 130 are configured to measure electrical characteristics of each output electrical power generated by the plurality of signal conditioners 120. One or more measuring instruments may be operatively coupled to each signal conditioner of the plurality of signal conditioners 120. Measuring instruments 130 may further be configured to produce, or output, one or more reading signals indicative of, or corresponding to, the measured electrical characteristics. In some examples, a separate reading signal is produced for each output electrical power generated by signal conditioners 120. In other examples, a reading signal is produced which is indicative of the combination of two, three, or more output electrical powers generated by signal conditioners 120.

Processing system 140 may be configured to generate the control signal and to supply it to the converter module. Processing system 140 may further be configured to monitor the output electrical power of each signal conditioner. In some examples, processing system 140 may at least partly rely on the reading signal produced by measuring instruments 130 to monitor the output electrical powers of signal conditioners 120. Therefore, processing system 140 may be configured to obtain the one or more reading signals from measuring instruments 130. In response to obtaining the one or more reading signals, processing system 140 may be configured to adjust operational parameters of the signal conditioners 120, to adjust the control signal, and/or to adjust any other operational parameter or signal of multi-channel power controller 100. In this way, processing system 140 provides a feedback mechanism for monitoring and regulating the outputs of multi-channel power controller 100.

Processing system 140 may comprise a microcontroller, a microprocessor, a graphics processing unit (GPU), a digital signal processor, and/or one or more field-programmable gate arrays (FPGAs).

Multi-channel power controller 100 is powered by direct current (DC) power supply 102, which is itself powered by power source 104. Power source 104 may be an alternating current (AC) power source, such as mains power. In other examples, power source 104 is a DC power source. DC power supply 102 may be an AC-DC supply, a switched-mode power supply, a linear regulator, a battery, a fuel cell, a solar cell, or any other type of DC power supply. In some examples, DC power supply 102 is a bench power supply.

Two or more input electrical power levels may be necessary in order to power different components of multi-channel power controller 100, in order to account for different power requirements of these components. For example, components such as the converter module 120 and the processing system 140, which may include logic gates or digital circuits, would require a first voltage level (e.g. 1.8, 2.5, 3.3, or 5 volts), while components such as the signal conditioners 120, which may include amplifiers, would require a second voltage level (e.g. 15 or 30 volts). In some examples, the two or more input electrical power levels may be provided directly by DC power supply 102. In other examples, DC power supply 102 provides a single DC input power, and multi-channel power controller 100 comprises a power converter, such as a DC-to-DC converter, to generate input electrical power levels other than those provided by DC power supply 102.

Figure 2:
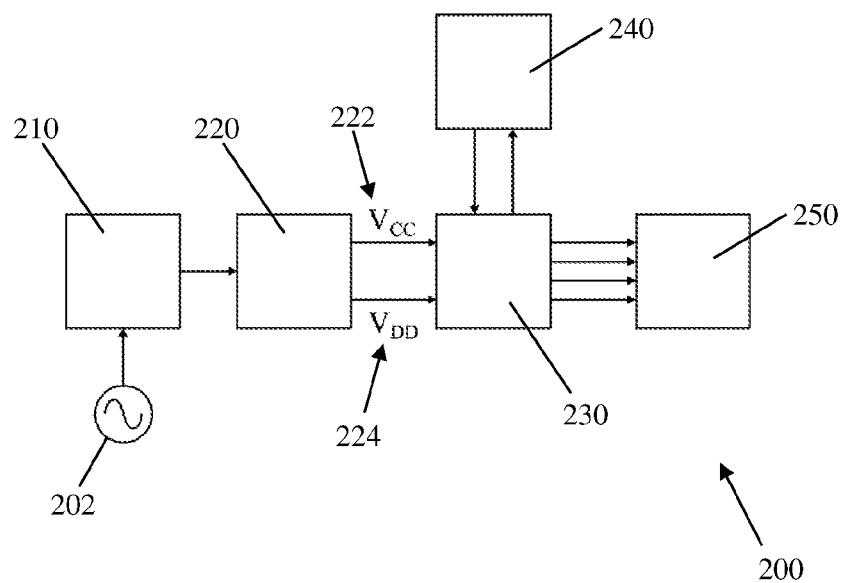
FIG. 2 illustrates a functional block diagram of an example power control system.

Referring to FIG. 2, there is illustrated an example power control system 200. Power control system 200 comprises an AC-DC converter 210 coupled to an AC power source 202. AC-DC converter 210 rectifies the AC power provided by AC power source 202 and generates a DC power output.

Power control system 200 further comprises a DC-to-DC converter 220 coupled to AC-DC converter 210. DC-to-DC converter 220 receives the DC power output from AC-DC converter 210 and generates a first electrical power level 222 and a second electrical power level 224, which is different from first electrical power level 222.

Power control system 200 further comprises a multi-channel power controller 230 coupled to DC-to-DC converter 220. Multi-channel power controller 230 is configured to power its internal components using first and second electrical power levels 222 and 224. Multi-channel power controller 230 is further configured to generate a plurality of output electrical powers using at least one of first and second electrical power levels 222 and 224.

Power control system 200 further comprises a programming device 240 in communication with multi-channel power controller 230, or with a processing system of multi-channel power controller 230. Communication between programming device 240 and multi-channel power controller 230 may occur through any wired or wireless interface, such as RS232, I$^2$C, SPI, USB, WIFI, or LAN. Programming device 240 may be a personal computer, a laptop, an embedded system, or any other processing system. Programming device 240 may allow a user to set or modify operational settings of multi-channel power controller 230. Programming device 240 may further be configured to set or modify values of the output electrical powers generated by multi-channel power controller 230.

Power control system 200 further comprises one or more loads 250 coupled to multi-channel power controller 230 and configured to receive the output electrical powers. In some examples, the output electrical powers are DC powers. In other examples, the output electrical powers are AC powers. The output electrical powers may be independent of each other, and each load 250 may draw from one or more of the output electrical powers. Therefore, multi-channel power controller 230 may be a device having multiple output power channels for supplying a plurality of output electrical. In some examples, multi-channel power controller 230 is a device for supplying and/or for controlling a plurality of output electrical powers. In some examples, multi-channel power controller 230 is a power controller.

In some examples, the multi-channel power controller is a feedback controlled multiple-output power supply. Multiple supplies may be daisy-chained, providing expandability to a virtually unlimited number of channels. User-defined objective functions, such as load and save data settings, clear all voltage button, lock GUI button, and the ability to program specific channels simultaneously, may be supported for the a device under test, or any load, providing significant flexibility over traditional bench power supplies. Using system identification or fast analysis that defines the impulse response from input to output, users can achieve feedback control by using this response without the laborious process normally associated with developing a bespoke controller. Therefore, the multi-channel power controller not only provides a more robust system that prevents overshoot, but also protects the device under test, or load, by limiting an overvoltage and/or an overcurrent.

In some examples, the multi-channel power controller is compact and provides a wide range of power outputs. In some examples, the multi-channel power controller is an integrated system that is capable of daisy chaining channels with a single reconfigurable DC supply input, and is able to reconfigure the channel connections in a simple manner with programmable switch/route, software library. In some examples, the multi-channel power controller provides integrated individual digital current reading output, multi-channels output with high voltage including polarity-switching capability, standalone operation, programmable gain on each channel, digital save/load, locking capability, easy integration with multiple sensors or transducer and reconfigurable multi-connectors.

In some examples, the multi-channel power controller is a fully digitally-controlled power supply with integration capability, compact with scalable channel outputs and locking capability of each channel for ensuring the safety of the device under test that requires proper handling. In some examples, the multi-channel power controller introduces the broad concept of extending the voltage output of single conventional power supply to accommodate different output voltages with different channels. In some examples, the multi-channel power controller provides an easy way of extending voltage channels that is capable of integration with multiple feedback input source such as sensors (e.g. temperature, humidity, and velocity sensors) and current reading data. This data may then be used for multi-inputs and multi-outputs feedback systems.

In some examples, the processing system, or programmable device, of the multi-channel power controller may be configured according to user preference with a library program, or a look-up table program by specifying the voltage and/or current on a designated channel, to increase the flexibility of channel output to the load, or to the device under test.

In some examples, the reconfigurable multi-connectors may comprise two or more package pins that are able to be configured with jumper or connection cable to multi connector packages.

In some examples, the multi-channel power controller may comprise an AC-DC converter connected to a DC-to-DC converter to provide two main power sources, or power levels, such as $V_{CC}$ and $V_{DD}$ to be distributed to the system.

In some examples, the connections line may comprise pins for monitoring outputs manually.

In some examples, high voltage DC-to-DC converters are integrated within the system to enable high voltage capability and digital reverse polarity control.

In some examples, the signal conditioner may comprise a programmable-gain amplifier with voltage follower unit which may be configured with a digital control signal and which may enable the output electrical power to be increased in terms of voltage and current range.

In some examples, the multi-channel power controller is a power supply extender with voltage limit control, programmable and locking capability. For instance, a user may use this feature to limit and lock specific voltage limit that could prevent damage a load, such as a chip or device under test.

In some examples, the multi-channel power controller is a channel extender module for increasing the number of power channels output from a conventional power supply device and subsequently controlling those power channels with a high degree of accuracy. The channel extension module is plugged into one or more channel outputs of a conventional power supply device to allow connection of more devices. By using a conventional power supply device, the current reading is simplified, as the load will draw current which correlates to the current drawing in a conventional power supply thus simplifying the channel extender circuits.

In some examples, the multi-channel power controller includes an inbuilt microcontroller/microprocessor and programmable hardware for allowing standalone or remote application by pre-programming the system and dynamically controlling the individual output channel. The channel extender system may also be programmed in a specific manner such as setting individual voltage limits and providing feedback control. For instance, the channel extender system may enable controlling any device required to stabilize its temperature, humidity, position, velocity, current by reading and feeding back the outputs from the connected sensors or transducers.

In some examples, the multi-channel power controller is a modular device that connects to a power supply, such as a benchtop power supply, for extending the number of output power channels of the power supply. In some examples, the modular device has the ability to daisy-chain to other similar modular devices. In some examples, the channel extender modules can be daisy-chained in series to provide availability for even more power channels. Example applications of the multi-channel power controller include thermo-optic or electro-optic controls, photonic integrated circuits, modulator, bias voltage source, current source, power supply for analog or digital electronic circuits, industrial control simulators, and embedded systems that require multiple power source inputs with different voltages.

Figure 3:
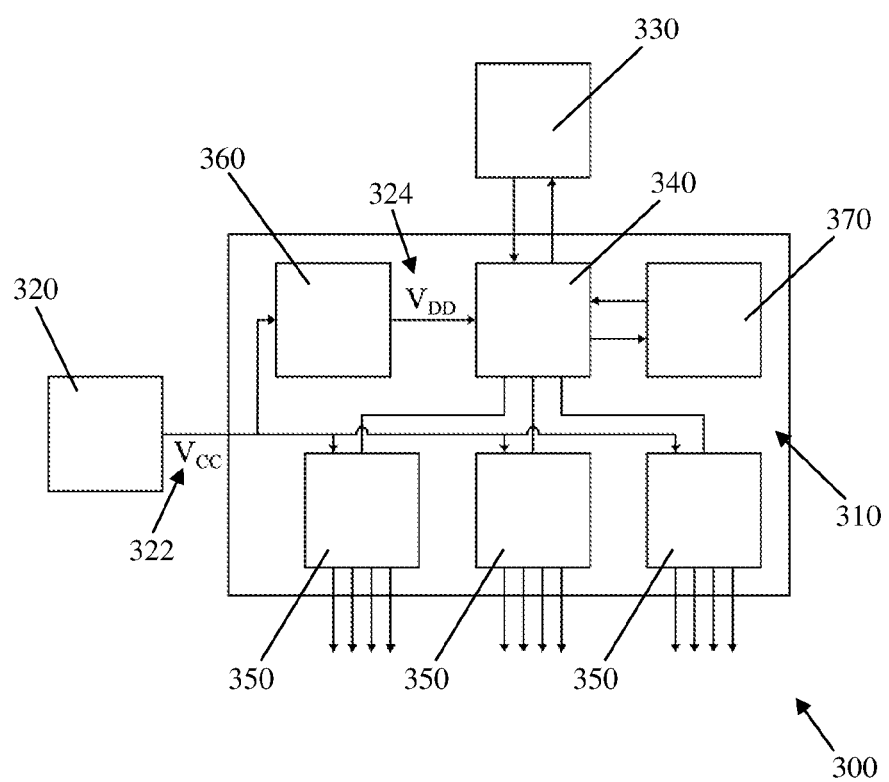
FIG. 3 illustrates a functional block diagram of another example power control system.
Figure 4:
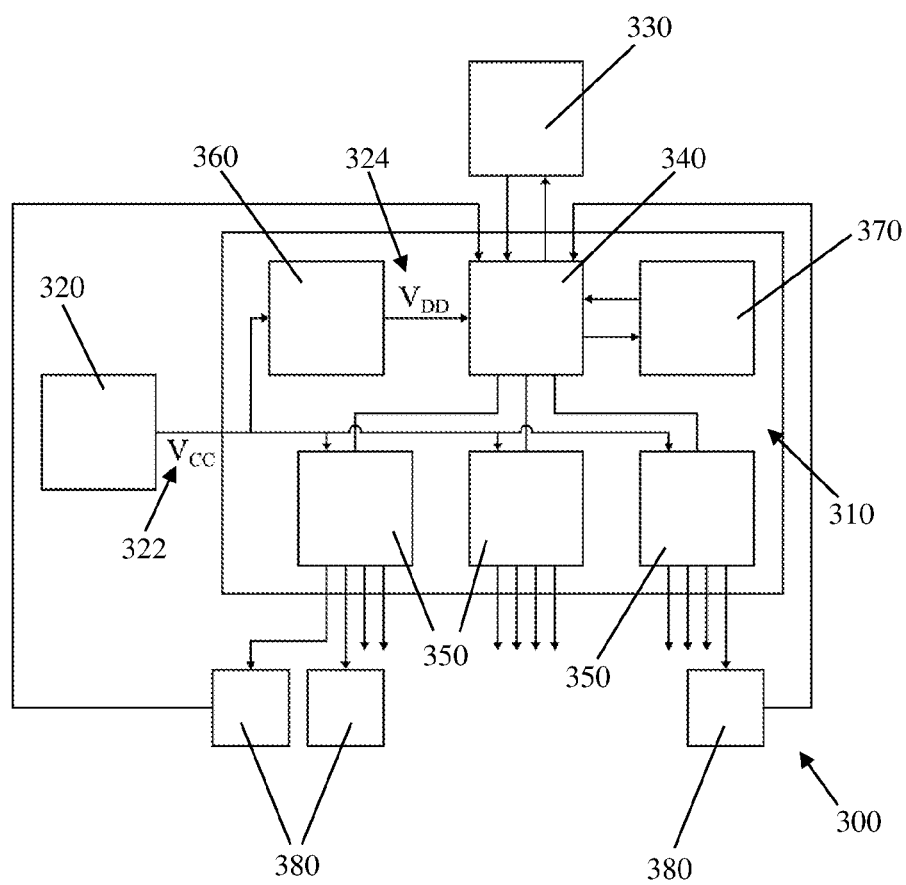
FIG. 4 illustrates the power control system of FIG. 3, with loads coupled thereto.

Referring to FIGS. 3 and 4, there is illustrated an example power control system 300. Power control system 300 comprises a multi-channel power controller 310, a power supply 320, and a programming device 330.

Multi-channel power controller 310 comprises a processing system 340 and three extender modules 350 operatively coupled to processing system 340. The number of extender modules is only for illustration purposes. In general, multi-channel power controller 310 may comprise one, two, or any other number of extender modules 350.

Power supply 320 is configured to supply an input electrical power to multi-channel power controller 310. In some examples, the input electrical power is an electrical signal comprising an electrical voltage and/or an electrical current. Power supply 320 may be a DC power supply supplying a single input DC electrical power. Extender modules 350 are configured to receive a first portion of the input electrical power, having a first power level 322. Extender modules 350 may be connected in parallel with power supply 320 so that each extender module 350 receives the same voltage.

Multi-channel power controller 310 further comprises a power converter 360 configured to receive a second portion of the input electrical power. Power converter 360 may be a DC-to-DC converter. Power converter 360 is further configured to convert the second portion of the input electrical power into a second power level, 324, for powering processing system 310. The second power level 334 may further be used for at least partly powering other components of power control system 300, such as the converter modules discussed below.

Processing system 340 is configured to generate one control signal for each extender module 350 (i.e. in this example, processing system 340 generates three control signals). Processing system 340 is further configured to send a control signal to each of extender module 350. In some examples, processing system 340 may comprise a multiplexer for selecting one or more of the extender modules 350. The processing system 340 may then send or route a control signal to the one or more extender modules 350 that have been selected.

In some examples, extender modules 350 are configured to facilitate coupling and/or decoupling of the processing system from the extender modules 350. In some examples, processing system 340 may be a microprocessor, a microcontroller, a digital signal processor, a GPU, or an FPGA. Processing system 340 may include an Arduino, TI DSP, Xillinx PYNQ, NVIDIA Jetson TX2, or any other type of processing unit. Some applications may have particular requirements that might necessitate a certain type of processing system 340. For example, a low-power processing system 340, such as LORA based processing units or NBIoT processing units, may be preferable within internet of things applications. Each extender module 350 may include communication pin slots/templates, or any other connection port, to allow it to couple to processing system 340. The connection port may be configured to enable easy replacement, or facilitate replacement, of extender module 350 and/or processing system 340.

In some examples, extender module 350 may also be used as a module for different types of processor or signal processing systems by plug-in to the communication pin such as via serial peripheral interface (SPI), Inter-Integrated Circuit (I²C), Pulse Width Modulation (PWM) pins directly to the extender module. In some examples, a connection port between extender module 350 and processing system 340 may support any other type of communication protocol. In some examples, extender module 350 may further be configured to process or modify the control signal or the output electrical powers.

Each extender module 350 is configured to receive a control signal from processing system 340, and to receive a portion of first power level 322. Each extender module 350 is further configured to generate a plurality of output electrical powers using the received control signal and the portion of first power level 322. In some examples, the control signal comprises data or information indicative of the magnitude of one or more of the output electrical powers. For example, the magnitude of the control signal may be proportional to the magnitude of one or more of the output electrical powers. In other examples, the control signal may comprise instructions for operating a respective extender module 350 to generate the plurality of output electrical powers.

Each extender module 350 may further be configured to communicate with other extender modules 350 of multi-channel power controller 310. Communication between extender modules 350 may be for the purpose of synchronising the generation of the plurality of output electrical powers by different extender modules 350, in order to achieve certain timing specifications. In some examples, communication is achieved by arranging and/or synchronising a signal clock (e.g. from processing system 340), sync signals, and an identification of the extender modules 350. In some examples, each extender module 350 comprises a communications module configured to communicate to corresponding communications modules of the other extender modules 350.

Programming device 330 may be in communication with processing system 340, and may be configured to set operational settings of processing system 340 and/or of multi-channel power controller 310. Programming device 330 may further be configured to program processing system 340, and to upload operation instructions (i.e. a software program) to processing system 340.

In some examples, programming device 330 is a processing system that provides a user interface, or a user interface device configured to allow a user to control multi-channel power controller 310, or to set input and/or output parameters of multi-channel power controller 310 (e.g. an output power level). In some examples, processing system 340 is configured to control and manage internal components of multi-channel power controller 310. In some examples, processing system 340 comprises one or more signal generators for generating the one or more control signals. In some examples, processing system 340 comprises one or more signal processors to generate, condition, or adjust the one or more control signals. In some examples, programming device 330 is not configured to generate the one or more control signals, and only processing system 340 may generate the control signals.

Multi-channel power controller 310 further comprises a memory 370. Memory 370 may be connected to, or in communication with, processing system 340. Memory 370 may be internal to processing system 340, or it may be external to processing system 340. Memory 370 may be configured to store operational settings or operation instructions relating to the operation of processing system 340 and/or multi-channel power controller 310. Processing system 340 may be configured to retrieve operational settings or operation instructions from memory 370.

Each extender module 350 comprises a plurality of output channels, or output ports, each output channel being configured to output an output electrical power of the plurality of electrical powers generated by the extender module. The output channels provide access to the generated output electrical power by a load.

Referring to FIG. 4, one or more loads 380 are connected to extender modules 350 via the output channels. Loads 380 may include electrical circuits or electrical devices. In some examples, loads include sensors configured to detect or measure electrical characteristics of the output electrical powers. The sensors may further be configured to generate a reading signal indicative of, or corresponding to, the measured electrical characteristics. Loads 380 may be powered by the output electrical powers outputted by multi-channel power controller 310.

In some examples, at least one load 380 is a sensor configured to measure environmental characteristics of an environment in the vicinity of, or proximal to, the multi-channel power controller. The sensor may be a temperature sensor, a humidity sensor, a velocity sensor, or any other sensor. The sensor may further be configured to provide a signal indicative of the measured environment characteristics to processing system 340.

Processing system 340 may be further configured to monitor the plurality of output electrical powers using the reading signals obtained from the load sensors. In response to receiving the reading signal, processing system 340 may be configured to adjust operational parameters of the one or more extender modules 350 to modify a value of one or more output electrical powers to which the reading signal corresponds. In this way, multi-channel power controller 310 implements a feedback control loop.

Therefore, multi-channel power controller 310 receives a single input power from power supply 320 and outputs a plurality of output powers for powering loads. The plurality of output electrical powers may be controlled through a single device (i.e. multi-channel power controller 310 or programming device 330). In order to extend the number of output channels of multi-channel power controller 310 one may use additional extender modules. The additional extender modules may be connected in parallel to power supply 320, or they may be daisy chained with other existing extender modules 350. For example, an additional extender module may be operatively coupled one of the output channels of an extender module 350, such that the output electrical power of the existing extender module 350 becomes the input electrical power of the additional extender module.

Figure 5:
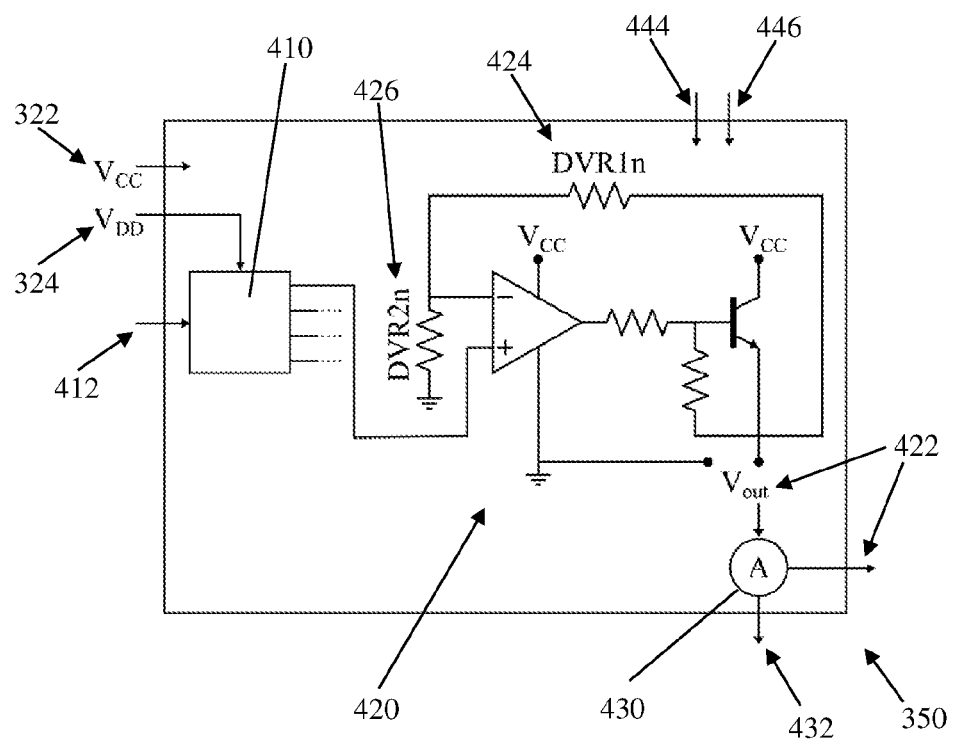
FIG. 5 illustrates a functional block diagram of an example extender module for the power control system of FIG. 3.

Referring to FIG. 5, there is illustrated an example extender module 350 of multi-channel power controller 310. Extender module 350 comprises a converter module 410, a plurality of signal conditioners, and a plurality of measuring instruments, or measurement modules. For illustration purposes, only one signal conditioner 420 and one measurement instrument 430 are illustrated, corresponding to one of the plurality of outputs of extender module 350. However, it should be understood that similar or matching signal conditioners and measuring instruments are provided for each of the other outputs of extender module 350.

Extender module 350 is configured to receive a portion of first power level 322 for powering the signal conditioners 420. Furthermore, it is configured to receive a portion of second power level 324 for powering converter module 410. In other examples, a portion of first power level 322 and second power level 324 may be used to power any component of extender module 350.

Converter module 410 is configured to convert the control signal 412 received from processing system 340 into a plurality of intermediate signals. In some examples, converter module 410 is a digital-to-analog converter (DAC), or a multi-channel DAC, such as an LTC2600 from Linear Technology Corporation, a DAC8512 from Analog Devices Inc, an MCP47FEB22A0-E/ST Microchip, an MAX5723 from Maxim Integrated Products Inc, or any other DAC. In some examples, the control signal is a digital signal and the plurality of intermediate signals are analog signals. In other examples, converter module 410 is an electrical splitter, or divider, configured to split or divide control signal 412 into a plurality of intermediate signals, for example, by splitting a power of control signal 412.

The intermediate signal may be the signal that propagates from converter module 410 to signal conditioner 420. The intermediate signal may have a magnitude proportional to the magnitude of the corresponding output electrical power to be generated. In some examples, the intermediate signal may comprise instructions for operating a signal conditioner 420 to generate the plurality of output electrical powers. In some examples, the intermediate signal may be an intermediate control signal, or an analog control signal.

Converter module 410 may produce one, two, three or any number of intermediate signals (e.g. four or eight). The intermediate signals produced by converter module 410 may be the same, or they may be different from each other. Each intermediate signal is then sent to a separate signal conditioner 420. In some examples, the number of signal conditioners 420 corresponds to the number of output ports of converter module 410 configured to output intermediate signals.

Each signal conditioner 420 is configured to generate an output electrical power 422 by adjusting electrical characteristics, or electrical properties, of the intermediate signal. The electrical characteristics may comprise one or more of a voltage and a current of the intermediate signal. In some examples, the electrical characteristics may comprise any one of a power, amplitude, phase, and frequency of the intermediate signal.

Signal conditioner 420 comprises a voltage conditioning stage or circuit, which comprises an operational amplifier in a voltage-follower configuration, and a current conditioning stage or circuit, which comprises a bipolar junction transistor. Signal conditioner 420 may be configured to independently adjust the voltage and current of the intermediate signal. Both the voltage conditioning stage (i.e. the operational amplifier) and the current conditioning stage are supplied with, or powered by, a portion of first power level 322. In some examples, signal conditioner 420 comprises a gain circuit.

Output electrical power 422 may be controlled or modified by adjusting operational parameters of signal conditioner 420. The operational parameters may comprise the resistance, impedance, gain, or any other electrical parameter of the electrical components of signal conditioner 380. In this example, the voltage conditioning stage comprises two variable resistors 424 and 426 whose resistance value may be adjusted by resistance control signals 444 and 446, respectively, generated by processing system 310.

In some examples, signal conditioner 420 is configured to generate output electrical power 422 by adjusting electrical characteristics of the input electrical power, or first power level 322. In some examples, output electrical power 422 may be a function of, or depend on, both first power level 322 (or the input electrical power) and the intermediate signal.

Measuring instrument 430 is configured to measure electrical characteristics of output electrical power 422. Measuring instrument 430 is an ammeter for measuring the current of electrical power 422. In other examples, the measured electrical characteristics comprise one or more of the voltage, current, or any other electrical characteristic of output electrical power 422. Consequently, measuring instrument 430 may comprise any instrument necessary to measure the specified characteristics, such as a voltmeter, an ammeter, or a power meter. Following measurement, output electrical power 422 is output from extender module 350.

Output electrical power 422 may be an electrical signal comprising an electrical voltage and/or an electrical current. In some examples, prior to the connection of a load 380 to the output channel of extender module 350, output electrical power 422 is an electrical voltage (since there is no load to draw an electrical current). Once load 380 is connected, the load may draw the output electrical power comprising both an electrical voltage and an electrical current.

Measuring instrument 430 is further configured to generate a measurement signal 432 indicative of the electrical characteristics measured. Measurement signal 432 may be sent to processing system 340 for monitoring purposes.

Figure 6:
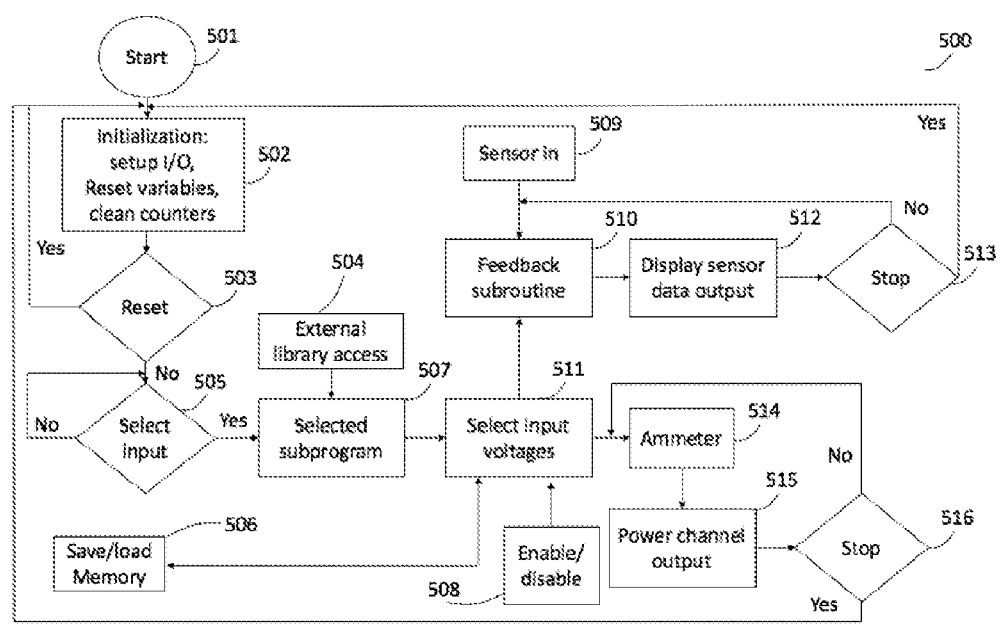
FIG. 6 illustrates an example method of initiating a processing system of a power control system.

Referring to FIG. 6, there is illustrated an example method 500 of initiating the processing system of a power control system. At step 502, a remote program identifier is read from an external device plugged into the processing system. If reset 503 is chosen, re-initialization occurs and method 500 returns to the start 501. In order to supply a specific output channel of the power control system, select input 505 is arranged such that it may select the intended sub-program 507. At step 510, a remote program controlled by the external device may then input a voltage setting corresponding to a voltage of the output electrical power. This also allows, at step 514, the measurement settings of an ammeter sensor 514. At step 506, saving and/or loading to a memory may provide storage for the settings of the output channels of the power control system controlled by an enable/disable routine 508. The ammeter 514 is connected to an output channel 515 and controlled with subroutine 516. External feedback input from sensor 509 such as temperature, humidity, velocity, etc, might also be connected to provide feedback control capability with feedback subroutine 510. The data from this sensor and feedback system can then be displayed with display device 512 such as TFT touch screen or conventional monitor of the multi-channel power controller. External library access 504 provides command set for external programmer or external command that enable dynamic configuration according to the intended function such as temperature feedback controller, or any other function.

Figure 7:
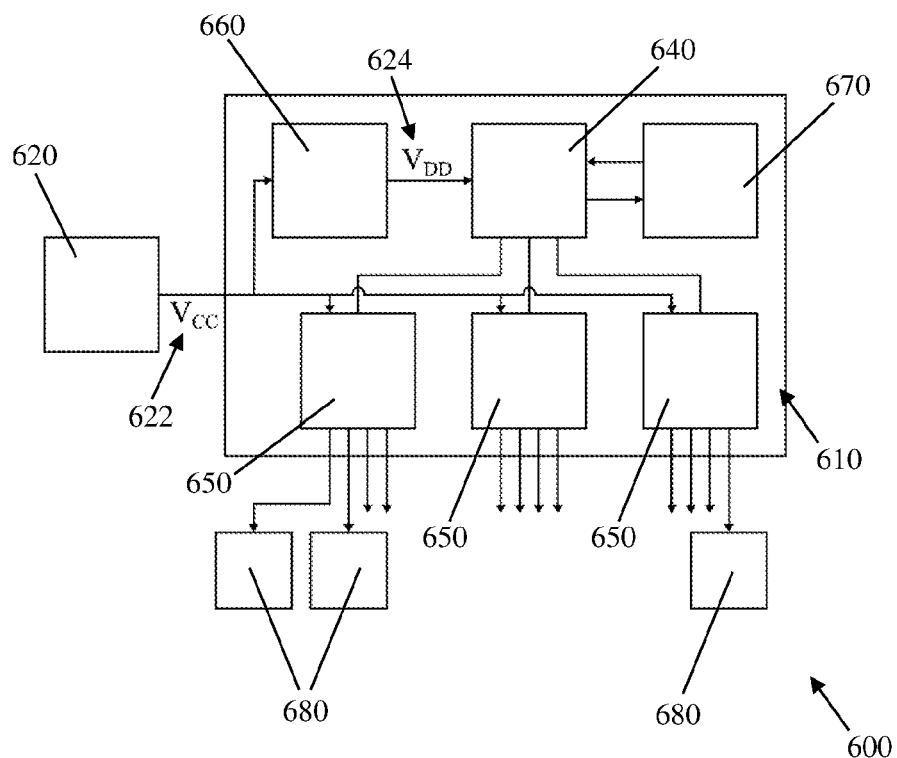
FIG. 7 illustrates a functional block diagram of another example power control system.

Referring to FIG. 7, there is illustrated another example power control system 600. Power control system 600 comprises a multi-channel power controller 610 and a power supply 620. Multi-channel power controller 610 comprises a processing system 640, a plurality of extender modules 650, and a power converter 660. Multi-channel power controller 610 is powered by power supply 620 which provides a single input electrical power having a first power level 622 to extender modules 650 and to power converter 660. Power converter 660 converts a portion of the input electrical power to a second power level 624 for powering at least processing system 640.

Multi-channel power controller 610 further comprises a memory 670 configured to store a bootloader for processing system 640, or for any other programmable device included in multi-channel power controller 610 (e.g. an FPGA). Therefore, multi-channel power controller 610 is a stand-alone power control system, capable of operating without being connected to an external programming device or an external processing system. In some examples, a user may control multi-channel power controller 610 directly through processing system 640.

In some examples, power supply 620 is contained within multi-channel power controller 610 so that multi-channel power controller 610 is a self-contained multi-channel power controller. Power supply 620 may be a battery, a fuel cell, a solar or photovoltaic cell, or any other DC power supply.

Each extender module 650 comprises a plurality of output channels, each output channel being configured to output an output electrical power of the plurality of electrical powers generated by the extender module 650. One or more loads 680 are connected to extender modules 650 via the output channels. Loads 680 may include electrical circuits, electrical impedances, or devices such as sensors. Each load 680 is configured to independently draw the output electrical power provided by extender modules 650 through one or more of its output channels.

Figure 8:
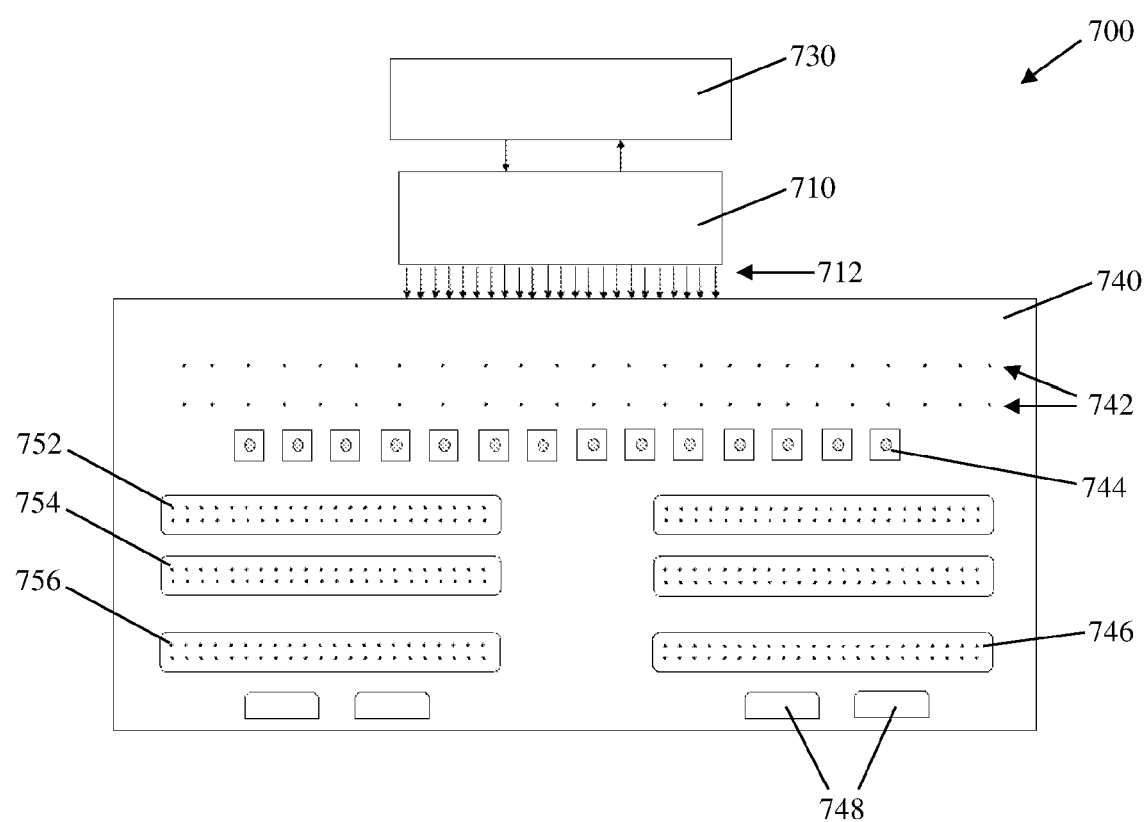
FIG. 8 illustrates a functional block diagram of another example power control system, including a connector board.

Referring to FIG. 8, there is illustrated an example power control system 700 comprising a multi-channel power controller 710, a power supply (not shown) configured to supply an input electrical power to multi-channel power controller 710, and a programming device 730 in communication with a processing system of multi-channel power controller 710.

Multi-channel power controller 710 comprises a plurality of output channels 712, each output channel being configured to output an electrical power generated by the multi-channel power controller 710.

Power control system 700 further comprises a connector board 740 operatively coupled to multi-channel power controller 710. Connector board 740 may comprise a plurality of electrical connectors, electrical ports, or coupling means for connecting to an electrical cable or wire. Each electrical connector may be operatively coupled to one or more output channels of multi-channel power controller 710. Therefore, connector board 740 provides a spatial arrangement for the output channels into a standard connector configuration.

Connector board 740 may comprise single-pin connectors or adapters, such as metal access, or metal pins, 742, and BNC/SMA connectors or adapters 744. Each metal pin 742 may be operatively coupled to an output channel 712 of multi-channel power controller 710, allowing a user to tap a single output electrical power, for example, for a voltage reading or for connection to a device under test. Connector board 740 may further comprise multi-pin connectors or adapters, such as ribbon cable connectors 746, flexible flat cable (FFC/FPC) connectors 748, or any other cable connector type. BNC cable connector 744, ribbon cable connector 746, and flexible flat cable connector 748 may be used to connect one or more output channels 712 (or one or more output electrical powers) of multi-channel power controller 710 to a load or device under test.

In some examples, connector board 740 is a reconfigurable connector board, configured to allow one or more output channels 712 to selectively connect to a first or to a second connector of connector board 740. In some examples, the reconfiguration is done by using a cable jumper through a male ribbon connector. For example, to allow for reconfiguration, male ribbon connector 752 may need to be separated or disconnected from male ribbon connector 754. Ribbon cable connector 756 may then be routed in connection with male ribbon connector 754. In order to configure the connection, a jumper connection may be connected between male ribbon connectors 752 and 754. Ribbon cable connector 756 may then be connected directly to a load or device under test.

Figure 9:
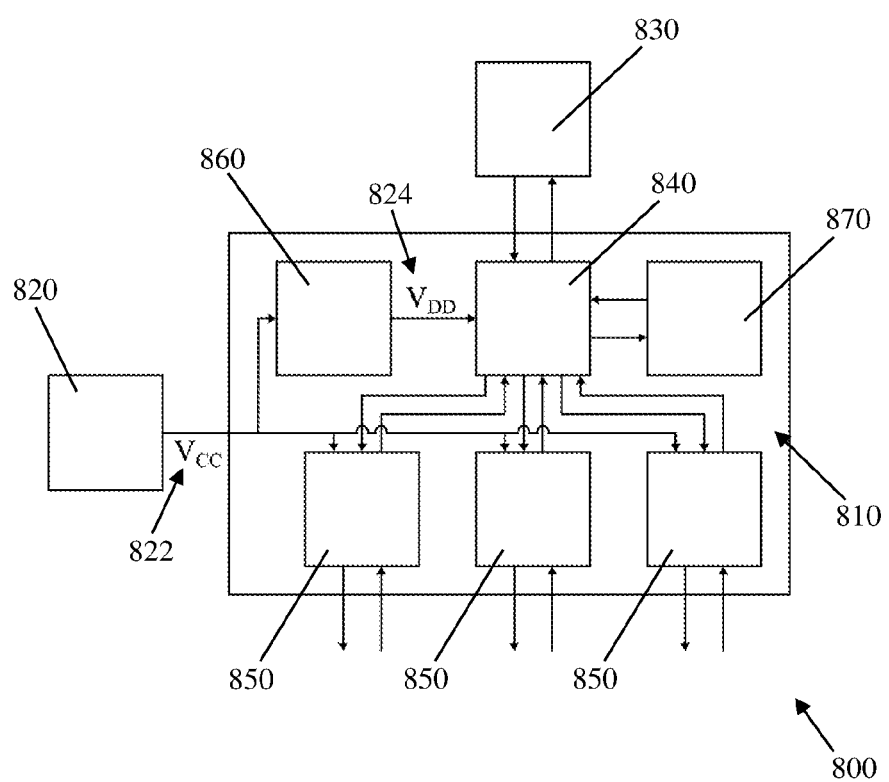
FIG. 9 illustrates a functional block diagram of another example power control system, including current sources.

Referring to FIG. 9, there is illustrated another example power control system 800. Power control system 800 comprises a multi-channel power controller 810, a power supply 820, and a programming device 830.

Multi-channel power controller 810 comprises a processing system 840 and three extender modules, which may be current sources 850, operatively coupled to processing system 840. The number of current sources is only for illustration purposes. In general, multi-channel power controller 810 may comprise one, two, or any other number of current sources 850.

Power supply 820 is configured to supply an input electrical power to multi-channel power controller 810. Power supply 820 may be a DC power supply supplying a single input DC electrical power. Current sources 850 are configured to receive a first portion of the input electrical power, having a first power level 822. Current sources 850 may be connected in parallel with power supply 820 so that each current source 850 receives the same voltage.

Power control system 800 further comprises a power converter 860 configured to receive a second portion of the input electrical power. Power converter 860 may be a DC-to-DC converter. Power converter 860 is further configured to convert the second portion into a second power level, 824, for powering processing system 810. The second power level 834 may further be used for at least partly powering other components of power control system 800.

Processing system 840 is configured to generate one control signal for each current source 850 (i.e. in this example, processing system 840 generates three control signals). Processing system 840 is further configured to send a control signal to each current source 850. In some examples, processing system 840 may comprise a multiplexer for selecting one or more of the current sources 850. The processing system 840 may then send or route a control signal to the one or more current sources 850 that have been selected.

Each current source 850 is configured to receive a control signal from processing system 840, and to receive a portion of first power level 822. Each current source 850 is further configured to generate one or more output electrical currents using the received control signal and the portion of first power level 822. The control signal may be an electrical voltage having a value between, for example, 0 volts and 40 volts. The output electrical current produced by each current source 850 may have a value between, for example, 0 amps and 20 amps. Each current source 850 may be isolated from the other current sources 850, and may be configured to supply the output electrical current to a load or a device under test, such as a laser, or any other current-drawing device.

Each current source 850 may be a current source configured to be controlled by the received control signal and to generate an output electrical current based on the received control signal. The current source may be further configured to be powered by the portion of the input electrical power. In some examples, current source 850 may be an LD1255P or LD3000R from Thorlabs Inc, a CTL100-A-400 from Koheron, a SF6100 from Fedal, or any other current source device or system.

Each current source 850 may also be configured to communicate with processing system 840 to provide an analog and/or digital feedback system. Operational parameters of each current source, such as a temperature and output current value, may be communicated to processing system 840. Processing system 840 may in turn be configured to monitor the operational characteristics of each current source 850 and to adjust operational parameters of each current source 850 to adjust, modify, or stabilise the operational characteristics. In this way, multi-channel power controller 810 comprises a feedback system, which may be an analog and/or a digital feedback system, to monitor and adjust operational characteristics of the current sources 850.

Programming device 830 may be in communication with processing system 840, and may be configured to set operational settings of processing system 840 and/or of multi-channel power controller 810. Programming device 830 may further be configured to program processing system 840, and to upload operation instructions (i.e. a software program) to processing system 840.

Multi-channel power controller 810 further comprises a memory 870. Memory 870 may be connected to, or in communication with, processing system 840. Memory 870 may be internal to processing system 840, or it may be external to processing system 840. Memory 870 may be configured to store operational settings or operation instructions relating to the operation of processing system 840 and/or multi-channel power controller 810.

Figure 10:
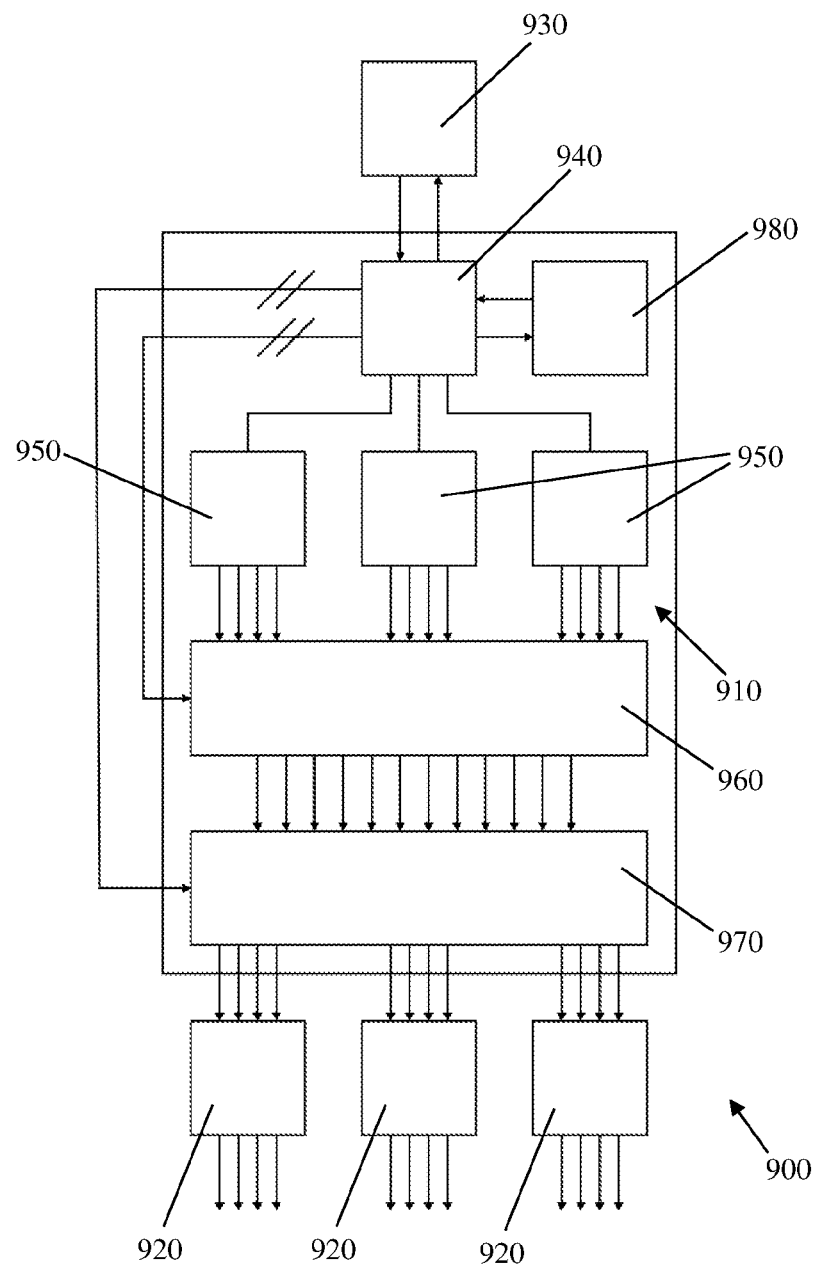
FIG. 10 illustrates a functional block diagram of another example power control system, including a switching module.

Referring to FIG. 10, there is illustrated another example power control system 900 having reconfigurable route connections. Power control system 900 comprises a multi-channel power controller 910, one or more connector boards 920, a power supply (not shown) configured to supply an input electrical power to multi-channel power controller 910, and a programming device 930 in communication with a processing system of multi-channel power controller 910.

Multi-channel power controller 910 comprises a processing system 940 and three converter modules 950, operatively coupled to processing system 940. The number of converter modules is only for illustration purposes. In general, multi-channel power controller 910 may comprise one, two, or any other number of converter modules 950.

Processing system 940 is configured to generate one control signal for each converter module 950 (i.e. in this example, processing system 940 generates three control signals). Processing system 940 is further configured to send a control signal to each converter module 950. Each converter module 950 is configured to receive a control signal, and to convert the received control signal into a plurality of intermediate signals.

In some examples, converter modules 950 are digital-to-analog converters, which convert the digital control signal into a plurality of analog intermediate signals. In other examples, converter modules 950 are signal splitters or signal dividers, which split the received control signal into a plurality of component intermediate signals. In some examples, both the control signal and the intermediate signals are analog signals. In other examples, both the control signal and the intermediate signals are digital signals.

Multi-channel power controller 910 further comprises a switching module 960 operatively coupled to the converter modules 950, and a plurality of signal conditioners 970 operatively coupled to switching module 960. Switching module 960 is configured to receive the plurality of intermediate signals from the converter modules 950 and to route each received intermediate signal to one of the plurality of signal conditioners 970.

Switching module 960 may comprise a plurality of input ports for receiving the intermediate signals from converter modules 950. Switching module 960 may further comprise a plurality of output ports for outputting the routed intermediate signals. Switching module 960 may further comprise a plurality of switches, or a network or array of switches, connecting the input ports to the output ports. The switches may be programmable, such that an input port may be configured to connect to any of the output ports. In some examples, switching module 960 is an FPGA. In some examples, switching module 960 comprises programmable digital switches.

Each signal conditioner 970 is configured to generate an output electrical power by adjusting electrical characteristics of the received intermediate signal. Each signal conditioner 970 may comprise a voltage conditioning stage or circuit, which comprises an operational amplifier in a voltage-follower configuration, and a current conditioning stage or circuit, which comprises a bipolar junction transistor. Each signal conditioner 970 may be configured to independently adjust the voltage and current of the intermediate signal.

Processing system 940 may be configured to control the operation of switching module 960. For example, processing system 940 may be configured to select one intermediate signal and one signal conditioner, and to control switch module 960 to route the selected intermediate signal to the selected signal conditioner through switching module 960. Processing system 940 may further be configured to control the operation of signal conditioners 970. For example, processing system 940 may be configured to adjust resistance values of variable resistors and to adjust a gain of amplifiers contained in signal conditioner 970.

The power supply (not shown) is configured to supply an input electrical power to multi-channel power controller 910. The power supply may provide a single DC input electrical power. A first portion of the input electrical power may be used for powering signal conditioners 970, in addition to any other active element of multi-channel power controller 910. Multi-channel power controller 910 may further comprise a power converter configured to receive another portion of the input electrical power and to convert it to a power level suitable for powering digital elements of multi-channel power controller 910, such as processing system 940, converter modules 950, and switching module 960.

Connector boards 920 are operatively coupled to signal conditioners 970. Connector boards 920 may comprise single-pin connectors and/or multiple-pin connectors. Each connector may be operatively coupled to one or more output channels of signal conditioners 970, so as to provide access to the output electrical powers outputted by the one or more output channels.

Multi-channel power controller 910 further comprises a memory 980. Memory 980 may be connected to, or in communication with, processing system 940. Memory 980 may be internal to processing system 940, or it may be external to processing system 940. Memory 980 may be configured to store operational settings or operation instructions relating to the operation of processing system 980 and/or multi-channel power controller 910.

Figure 11:
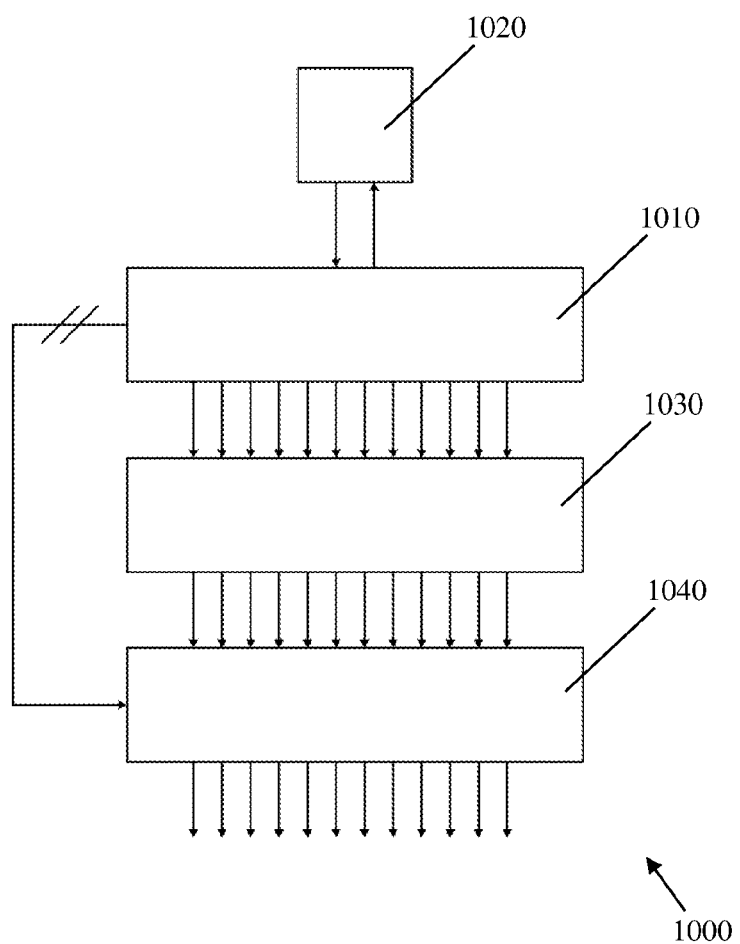
FIG. 11 illustrates a functional block diagram of another example power control system, including a multi-channel power converter.

Referring to FIG. 11 there is illustrated another example power control system 1000. Power control system 1000 comprises a multi-channel power controller 1010, a power supply (not shown) configured to supply an input electrical power to multi-channel power controller 1010, a programming device 1020 in communication with a processing system of multi-channel power controller 1010, a multi-channel power converter 1030, and a connector board 1040.

Programming device 1020 may be configured to operate multi-channel power controller 1010. Programming device 1020 may further be configured to program and set operational settings of multi-channel power controller 1010.

Multi-channel power controller 1010 comprises a plurality of output channels, each output channel being configured to output an output electrical power generated by multi-channel power controller 1010.

Multi-channel power converter 1030 is operatively coupled to multi-channel power controller 1010 and is configured to receive the plurality of output electrical powers generated by multi-channel power controller 1010. Multi-channel power converter 1030 is further configured to convert, adjust, or modify a power level of the received output electrical powers. For example, multi-channel power converter 1030 may convert one of the received output electrical powers from a first power level to a second power level that is different from the second power level. Multi-channel power converter 1030 may adjust a voltage level, a current level, or both voltage and current levels of the received output electrical powers.

Multi-channel power converter 1030 may comprise a plurality of power converters. In some examples, each power converter of multi-channel power converter 1030 is configured to operate on one of the output electrical powers of multi-channel power controller 1010. The power converters of multi-channel power converter 1030 may be the same or they may be different, and they may operate independently.

In some examples, multi-channel power converter 1030 comprises a plurality of high-voltage DC-to-DC converters, which may be configured to increase the voltage of the received output electrical powers, for example, up to 500 volts. In some examples, multi-channel power converter 1030 is a Q05 converter from XP Power.

In some examples, multi-channel power converter 1030 is configured to adjust a polarity of the received output electrical powers. For example, multi-channel power converter 1030 may switch the polarity of the voltage (or current) of one or more output electrical powers from positive to negative, or vice versa. This may be done using an MX type Spellman high-voltage DC-to-DC converter.

In some example applications, such as quantum spin or mass spectroscopy at very low temperatures, power control system 1000 may need to provide high voltages, such as between 500 volts and 1000 volts, with low currents in order to control the quantum state. Multi-channel power converter 1030 may be used to condition the output electrical powers to provide the voltage bias control necessary for such applications.

The processing system of multi-channel power controller 1010 may be configured to control the operation of multi-channel power converter 1030. For example, the processing system may be configured to control multi-channel power converter 1030 to switch a polarity of one or more output electrical power, or to set an output power level or gain factor of multi-channel power converter 1030. The processing system may generate one or more control signals for separately and independently controlling the plurality of power converters of multi-channel power converter 1030.

Connector board 1040 is operatively coupled to the output channels of multi-channel power converter 1030. Connector boards 1040 may comprise single-pin connectors and/or multiple-pin connectors. Each connector may be operatively coupled to one or more output channels of multi-channel power converter 1030, so as to provide access to the converted output electrical powers outputted by the one or more output channels.

Figure 12:
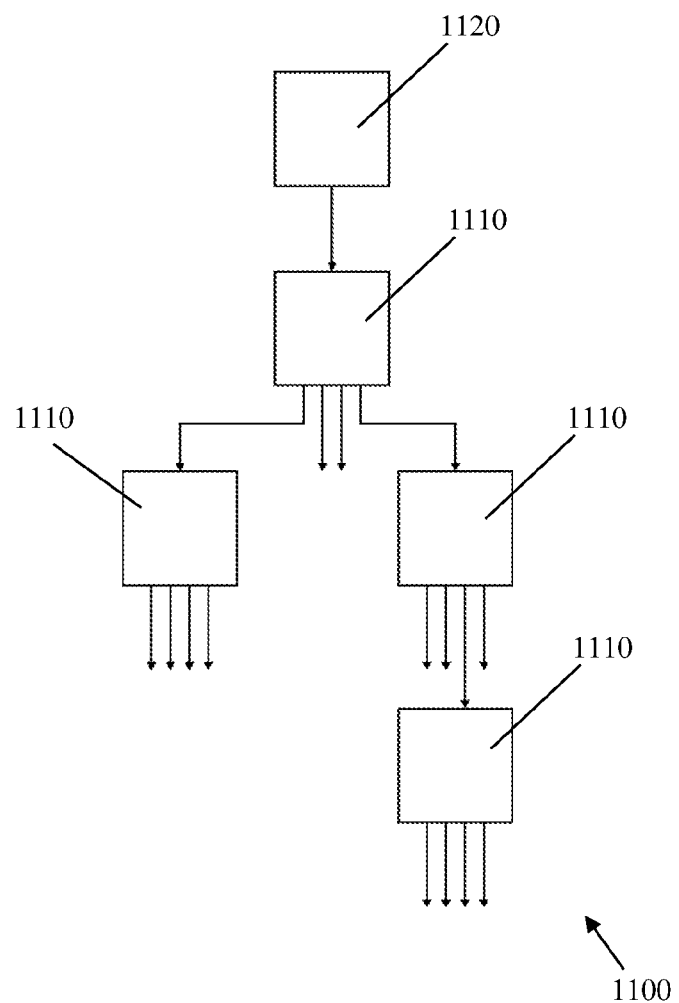
FIG. 12 illustrates a functional block diagram of another example power control system, including a plurality of daisy chained multi-channel power controllers.

Referring to FIG. 12 there is illustrated another example power control system 1100. Power control system 1100 comprises a plurality of multi-channel power controllers 1110 and a power supply 1120. Multi-channel power controllers 1110 are daisy chained, or connected together in a linear series.

Each multi-channel power controller 1110 is configured to receive an input electrical power and to generate a plurality of output electrical powers. Power supply 1120 is connected to a first multi-channel power controller, and supplies it with an input electrical power. Some of the output electrical powers generated by the first multi-channel power controller are supplied to the second multi-channel power controllers that are operatively connected to the first multi-channel power controller. The supplied output electrical powers from the first multi-channel power controller become the input electrical powers for the second multi-channel power controller.

Multi-channel power controllers 1110 may operate independently or they may cooperate, or be in synergy, with one another. In some examples, each multi-channel power controller 1110 has its own processing system. In other examples, multi-channel power controllers 1110 have a centralised processing system which controls the operation of all multi-channel power controllers 1110.

Daisy chaining multiple multi-channel power controllers allows a user to extend the number of output electrical powers, or output channels, provided by the power control system. In other examples, the extender modules described above may be daisy chained to extend the number of output electrical powers, or output channels, provided by a single multi-channel power controller.

Figure 13:
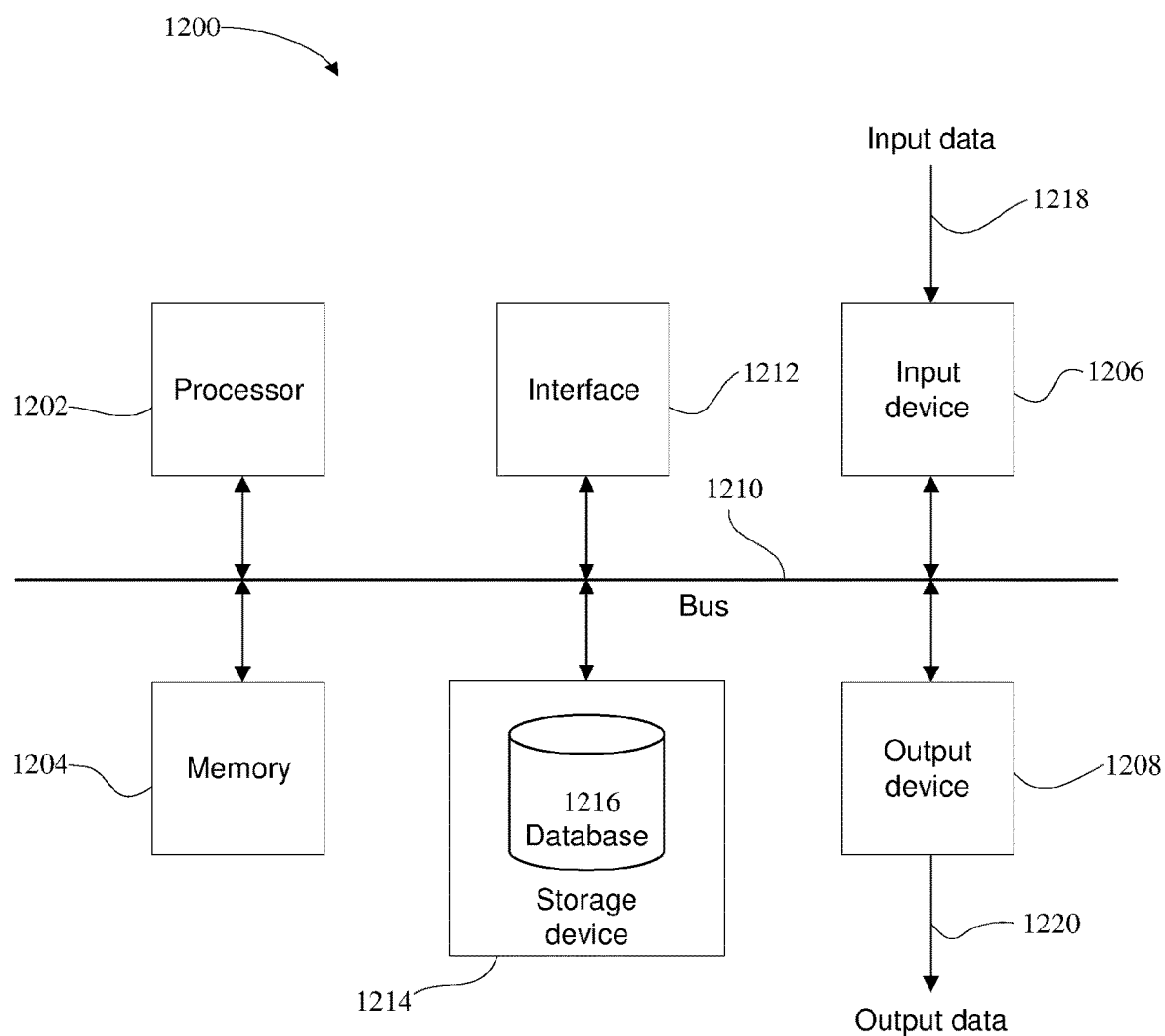
FIG. 13 illustrates a functional block diagram of an example processing system of a multi-channel power controller.

Referring to FIG. 13, there is illustrated an example processing system 1200 for use with a multi-channel power controller or power control system. In particular, the processing system 1200 generally includes at least one processor 1202, or processing unit or plurality of processors, memory 1204, at least one input device 1206 and at least one output device 1208, coupled together via a bus or group of buses 1210. In certain embodiments, input device 1206 and output device 1208 could be the same device. An interface 1212 can also be provided for coupling the processing system 1200 to one or more peripheral devices, for example interface 1212 could be a PCI card or PC card. At least one storage device 1214 which houses at least one database 1216 can also be provided. The memory 1204 can be any form of memory device, for example, volatile or non-volatile memory, solid state storage devices, magnetic devices, etc. The processor 1202 could include more than one distinct processing device, for example to handle different functions within the processing system 1200.

Input device 1206 receives input data 1218 and can include, for example, a keyboard, a pointer device such as a pen-like device or a mouse, audio receiving device for voice controlled activation such as a microphone, data receiver or antenna such as a modem or wireless data adaptor, data acquisition card, etc. Input data 1218 could come from different sources, for example keyboard instructions in conjunction with data received via a network. Output device 1208 produces or generates output data 1220 and can include, for example, a display device or monitor in which case output data 1220 is visual, a printer in which case output data 1220 is printed, a port for example a USB port, a peripheral component adaptor, a data transmitter or antenna such as a modem or wireless network adaptor, etc. Output data 1220 could be distinct and derived from different output devices, for example a visual display on a monitor in conjunction with data transmitted to a network. A user could view data output, or an interpretation of the data output, on, for example, a monitor or using a printer. The storage device 1214 can be any form of data or information storage means, for example, volatile or non-volatile memory, solid state storage devices, magnetic devices, etc.

In use, the processing system 1200 is adapted to allow data or information to be stored in and/or retrieved from, via wired or wireless communication means, the at least one database 1216. The interface 1212 may allow wired and/or wireless communication between the processing unit 1202 and peripheral components that may serve a specialised purpose. The processor 1202 receives instructions as input data 1218 via input device 1206 and can display processed results or other output to a user by utilising output device 1208. More than one input device 1206 and/or output device 1208 can be provided. It should be appreciated that the processing system 1200 may be any form of terminal, server, specialised hardware, microcontroller, microprocessor, or the like.

The multi-channel power controller and/or the power control system described above, may provide several advantageous effects including:

1) Reconfigurable multi-connector board enables channel reconfiguration using analog or digital arrangement.
2) Adjustable DC input correlates to DC output for overvoltage/power protection.
3) Automatic system identification using feedback to improve impulse response control to avoid overshoot/overvoltage on each channel.
4) Digital configurability of output amplification which can provide more flexibility and reconfigurability of the system.
5) Modular software control function enables scalable automatic control.
6) Method to lock, save and load configuration through a graphical user interface (GUI).
7) Enable easy configuration using a software library for voltage bank configuration using a look-up table arrangement.
8) Enable digital polarity switch without changing any physical connection.
9) Require single DC input rather than multiple voltage input converters or transformers.
10) Enable standalone application or automation with multiple channel setting.
11) Enable digital switching for current and voltage mode on each channel with real-time monitoring.
12) Provide safety initial setting provided by using relay configuration to avoid initial voltage and/or current spikes.

Optional embodiments may also be said to broadly include the parts, elements, steps and/or features referred to or indicated herein, individually or in any combination of two or more of the parts, elements, steps and/or features, and wherein specific integers are mentioned which have known equivalents in the art to which the invention relates, such known equivalents are deemed to be incorporated herein as if individually set forth.

Although a preferred embodiment has been described in detail, it should be understood that many modifications, changes, substitutions or alterations will be apparent to those skilled in the art without departing from the scope of the present invention.

Throughout this specification and the claims which follow, unless the context requires otherwise, the word "comprise", and variations such as "comprises" or "comprising", will be understood to imply the inclusion of a stated integer or step or group of integers or steps but not the exclusion of any other integer or step or group of integers or steps.

The invention claimed is:

1. A multi-channel power controller comprising:
   a processing system configured to generate one or more digital control signals;
   one or more extender modules operatively coupled to the processing system, each extender module comprising a plurality of output channels and being configured to:
   receive a digital control signal of the one or more digital control signals; and
   receive an input electrical power;
   wherein each extender module of the one or more extender modules comprises:
   a digital-to-analog converter module configured to convert the digital control signal received by the extender module into a plurality of intermediate analog signals, each intermediate analog signal being associated with one of the plurality of output channels of the extender module; and a plurality of signal conditioners powered by the input electrical power, each signal conditioner of the plurality of signal conditioners being configured to:

generate an output electrical power by adjusting electrical characteristics of an intermediate analog signal of the plurality of intermediate analog signals; and supply the output electrical power to an output channel of the plurality of channels of the extender module.

2. The multi-channel power controller of claim 1, wherein at least one signal conditioner of the plurality of signal conditioners comprises a voltage conditioning stage and a current conditioning stage for independently adjusting the voltage and current of the intermediate analog signal.

3. The multi-channel power controller of claim 1, wherein the multi-channel power controller further comprises a switching module configured to route each intermediate analog signal of the plurality of intermediate analog signals to a signal conditioner of the plurality of signal conditioners, and wherein the processing system is further configured to:

select an intermediate analog signal of the plurality of intermediate analog signals;

select a signal conditioner of the plurality of signal conditioners; and control the switching module to route the selected intermediate analog signal to the selected signal conditioner.

4. The multi-channel power controller of claim 1, wherein at least one extender module of the one or more extender modules is a current source, wherein the current source is configured to be controlled by the received digital control signal and to generate an output electrical current based on the received digital control signal, and wherein the current source is configured to be powered by the input electrical power.

5. The multi-channel power controller of claim 1, wherein at least one extender module of the one or more extender modules further comprises a plurality of measuring instruments configured to measure electrical characteristics of the plurality of output electrical powers.

6. The multi-channel power controller of claim 5, wherein the processing system is further configured to:

monitor the plurality of output electrical powers of the one or more extender modules; and adjust operational parameters of the one or more extender modules to modify a value of the respective plurality of output electrical powers.

7. The multi-channel power controller of claim 1, wherein the multi-channel power controller further comprises a power converter configured to receive a portion of the input electrical power and to convert said portion from a first power level into a second power level for powering the processing system.

8. The multi-channel power controller of claim 1, wherein the multi-channel power controller further comprises a power supply configured to generate the input electrical power.

9. The multi-channel power controller of claim 1, wherein the output channels of one or more extender modules are spatially arranged into a standard connector configuration.

10. The multi-channel power controller of claim 1, wherein each extender module of the one or more extender modules is configured to facilitate coupling and/or decoupling of the processing system from the extender module.

11. A power control system comprising:

a multi-channel power controller comprising:

a processing system configured to generate one or more digital control signals;

one or more extender modules operatively coupled to the processing system, each extender module comprising a plurality of output channels and being configured to:

receive a digital control signal of the one or more digital control signals; and receive an input electrical power;

wherein each extender module of the one or more extender modules comprises:

a digital-to-analog converter module configured to convert the digital control signal received by the extender module into a plurality of intermediate analog signals, each intermediate analog signal being associated with one of the plurality of output channels of the extender module; and a plurality of signal conditioners powered by the input electrical power, each signal conditioner of the plurality of signal conditioners being configured to:

generate an output electrical power by adjusting electrical characteristics of an intermediate analog signal of the plurality of intermediate analog signals; and supply the output electrical power to an output channel of the plurality of channels of the extender module;

a power supply configured to supply the input electrical power to the multi-channel power controller; and a programming device in communication with the processing system, the programming device being configured to set operational settings of the processing system.

12. The power control system of claim 11, wherein the power supply is an AC power supply, and wherein the power control system further comprises an AC-DC converter configured to convert the input electrical power from an AC power to a DC power prior to supplying it to the multi-channel power controller.

13. The power control system of claim 11, wherein the power control system further comprises a sensor operatively coupled to the multi-channel power controller, the sensor being configured to:

measure environmental characteristics of an environment in the vicinity of the multi-channel power controller; and provide a signal indicative of the measured environmental characteristics to the processing system.

14. The power control system of claim 13, wherein the processing system is further configured to adjust, in response to receiving the signal indicative of the measured environment characteristics, operational parameters of the one or more extender modules to modify a value of the respective plurality of output electrical powers.

15. The power control system of claim 13, wherein the sensor is powered by an output electrical power of the plurality of output electrical powers.

16. The power control system of claim 13, wherein the sensor is one of a temperature sensor, a humidity sensor, and a velocity sensor.

17. The power control system of claim 11, wherein the power control system further comprises a connector board comprising an electrical cable connector operatively coupled to one or more output channels of the plurality of output channels.

18. The power control system of claim 11, wherein the power control system further comprises a power converter configured to receive an output electrical power of the plurality of output electrical powers and to adjust a power level of the received output electrical power.

19. The power control system of claim 11, wherein the multi-channel power controller is a first multi-channel power controller, and the power control system further comprises a second multi-channel power controller operatively coupled to the first multi-channel power controller, wherein the input electrical power of the second multi-channel power controller is provided by an output electrical power of the plurality of output electrical powers of the first multi-channel power controller.

20. A power control system comprising a first multi-channel power controller as claimed in claim 1 and further comprising a second multi-channel power controller, wherein an input electrical power of the second multi-channel power controller is provided by an output electrical power of the plurality of output electrical powers of the first multi-channel power controller.

\* \* \* \* \*